US012641987B2

(12) United States Patent (10) Patent No.: US 12,641,987 B2
Xie et al. (45) Date of Patent: May 26, 2026

(54) DISPLAY SUBSTRATE, MANUFACTURING METHOD THEREFOR, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Taofeng Xie, Beijing (CN); Ming Hu, Beijing (CN); Bo Shi, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 481 days.

(21) Appl. No.: 18/033,077

(22) PCT Filed: May 20, 2022

(86) PCT No.: PCT/CN2022/094235
§ 371 (c)(1),
(2) Date: Apr. 21, 2023

(87) PCT Pub. No.: WO2023/221126
PCT Pub. Date: Nov. 23, 2023

(65) Prior Publication Data
US 2024/0381747 A1 Nov. 14, 2024

(51) Int. Cl.
*H10K 59/80* (2023.01)
*H10K 59/12* (2023.01)
*H10K 59/65* (2023.01)
*H10K 102/00* (2023.01)

(52) U.S. Cl.
CPC ..... *H10K 59/8791* (2023.02); *H10K 59/1201* (2023.02); *H10K 59/65* (2023.02); *H10K 2102/3026* (2023.02)

(58) Field of Classification Search
CPC ........... H10K 59/8791; H10K 59/1201; H10K 59/65; H10K 2102/3026
See application file for complete search history.

(56) References Cited

U.S. PATENT DOCUMENTS

2016/0161664 A1* 6/2016 Ishida .................. G02B 6/0045
359/230
2021/0088842 A1* 3/2021 Takimoto .................. F21S 2/00

* cited by examiner

*Primary Examiner* — David Y Chung
(74) *Attorney, Agent, or Firm* — Ling Wu; Stephen Yang; Ling and Yang Intellectual Property

(57) ABSTRACT

A display substrate includes a first display area and a second display area, the second display area is located on at least one side of the first display area, and the first display area is an under-screen-sensing region; the display substrate at least includes: a base substrate at least located in the first display area and the second display area and located on a side of the base substrate; a pixel circuit layer, at least part of which is located in the second display area; a first reflective interface located at least in the first display area and the second display area and located on a side of the base substrate away from the pixel circuit layer; a first polarizing structure, at least part of which is located in the second display area, and at least part of which is located between the base substrate and the first reflective interface.

19 Claims, 6 Drawing Sheets

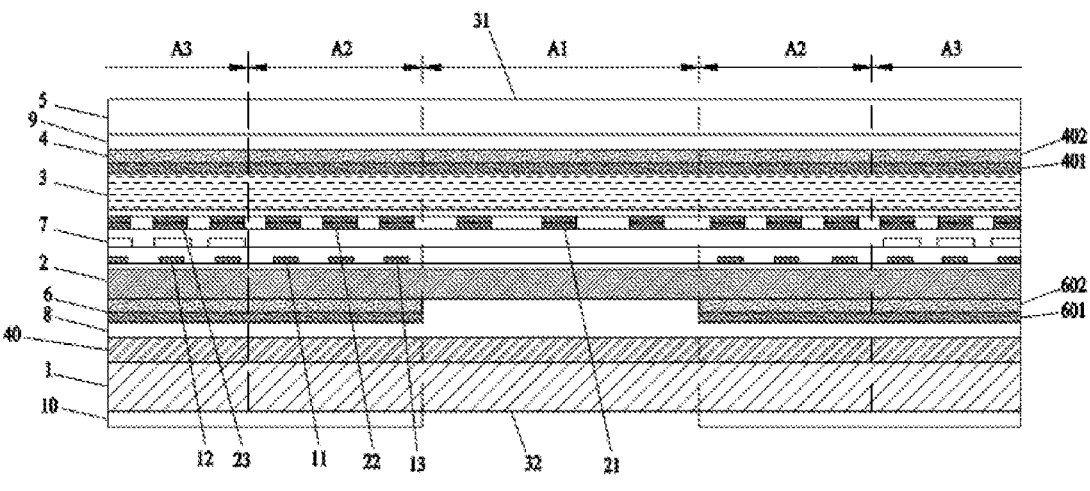
FIG. 2D
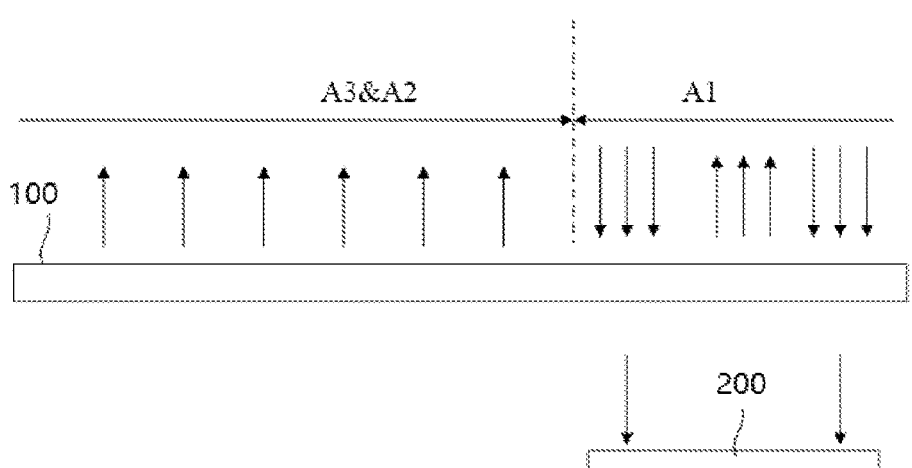
FIG. 2E
FIG. 3

DISPLAY SUBSTRATE, MANUFACTURING METHOD THEREFOR, AND DISPLAY DEVICE

CROSS-REFERENCE TO RELATED APPLICATION

The present application is a U.S. National Phase Entry of International Application PCT/CN2022/094235 having an international filing date of May 20, 2022, and entitled "Display Substrate, Manufacturing Method Therefor, and Display Device", the contents of the above-identified application are incorporated herein by reference.

TECHNICAL FIELD

The present disclosure relates, but is not limited, to the field of display technology, and in particular to a display substrate, a method for manufacturing the display substrate, and a display device.

BACKGROUND

With the continuous development of display technology, in order to maximize the screen-to-body ratio, technologies such as notch screen, teardrop screen and in-screen hole have successively came into being. These technologies reduce an area occupied by a camera in a peripheral region by providing an under-screen sensing region locally in a display area, for example, placing the camera under the under-screen sensing region, thereby increasing the screen-to-body ratio. However, undesirable phenomena such as dark rings close to the under-screen sensing region will appear in the above-mentioned display device, which will affect the display effect.

SUMMARY

The following is a summary of subject matter described herein in detail. The summary is not intended to limit the protection scope of claims.

In one aspect, the present disclosure provides a display substrate including a first display area and a second display area, wherein the second display area is located on at least one side of the first display area, and the first display area is an under-screen sensing region; the display substrate at least includes:

a base substrate at least located in the first display area and the second display area;

a pixel circuit layer, at least part of which is located in the second display area and on a side of the base substrate;

a first reflective interface located at least in the first display area and the second display area and located on a side of the base substrate away from the pixel circuit layer; the first reflective interface reflects at least part of light toward the pixel circuit layer; and a first polarizing structure, at least part of which is located in the second display area, and at least part of which is located between the base substrate and the first reflective interface, the first polarizing structure is configured to block incidence of light reflected by the first reflective interface onto the pixel circuit layer.

In an exemplary implementation mode, the display substrate further includes a third display area, the third display area is located on at least one side of the first display area and the second display area, at least part of the pixel circuit layer is located in the third display area, and at least part of the first polarizing structure is located in the third display area.

In an exemplary implementation, the display substrate further includes:

multiple first light emitting elements located in the first display area and on a side of the base substrate away from the first reflective interface;

second reflective interface located at least in the first display area and the second display area and at least on a side of the multiple first light emitting elements away from the base substrate, and the second reflective interface forms light emitted by at least one first light emitting element into reflected light;

a second polarizing structure, located at least in the first display area and the second display area and at least between the plurality of first light emitting elements and the second reflective interface, the second polarizing structure is configured to transmit the reflected light, so that the transmitted reflected light forms first circularly polarized light and the first circularly polarized light is emitted toward the first reflective interface; and the first reflective interface is configured to form the incident first circularly polarized light into second circularly polarized light and to reflect at least a part of the second circularly polarized light to the first polarizing structure; the first polarizing structure is configured to block incidence of the second circularly polarized light onto the pixel circuit layer.

In an exemplary implementation mode, the second polarizing structure includes a second linear polarizing film layer and a second phase difference film layer which are stacked, the second phase difference film layer is located on a side of the second linear polarizing film layer close to the base substrate, the second linearly polarizing film layer is configured to transmit the reflected light and form the transmitted reflected light into first linearly polarized light, and the second phase difference film layer is configured to transmit the first linearly polarized light and form the transmitted first linearly polarized light into the first circularly polarized light.

In an exemplary implementation mode, the first polarizing structure includes a first linear polarizing film layer and a first phase difference film layer which are stacked, the first phase difference film layer is located on a side of the first linear polarizing film layer close to the base substrate, the first phase difference film layer is configured to transmit the second circularly polarized light and form the transmitted second circularly polarized light into second linearly polarized light, and the first linearly polarizing film layer is configured to block transmission of the incident second linearly polarized light.

In an exemplary implementation mode, a polarization direction of the second linearly polarized light is perpendicular to a polarization direction of the first linearly polarizing film layer.

In an exemplary implementation mode, the orthographic projection of the first linear polarizing film layer on the base substrate does not overlap the first display area, and at least a part of the orthographic projection of the first phase difference film layer on the base substrate overlaps the first display area.

In an exemplary implementation mode, an orthographic projection of the first polarizing structure on the base substrate does not overlap with the first display area.

In an exemplary implementation mode, the display substrate further includes a back plate, the back plate is at least located in the first display area and the second display area, and at least located on a side of the first polarizing structure away from the base substrate, and the first reflective interface is formed at an interface between a surface of the back plate away from the base substrate and an outer side of the display substrate.

In an exemplary implementation mode, the display substrate further includes a composite film, the composite film is located at least in the second display area, the composite film is located at least on a side of the back plate away from the base substrate, and an orthographic projection of the composite film on the base substrate does not overlap with the first display area.

In the exemplary embodiment, the display substrate further includes a cover plate, the cover plate is located at least in the first display area and the second display area; the cover plate is located on a side of the second polarizing structure away from the base substrate; the second reflective interface is formed at an interface between a surface of the cover plate from the base substrate and an outer side of the display substrate.

In an exemplary implementation mode, the display substrate further includes an encapsulation layer, the encapsulation layer is located at least in the first display area and the second display area, the encapsulation layer is located on a side of the pixel circuit layer away from the base substrate.

In an exemplary implementation mode, the display substrate further includes multiple second light emitting elements, the pixel circuit layer includes multiple first pixel circuits and multiple second pixel circuits, the multiple second light emitting elements, the multiple first pixel circuits and the multiple second pixel circuits are all located in the second display area, the multiple second light emitting elements are located on a side of the pixel circuit layer away from the base substrate, the first pixel circuits are electrically connected with the first light emitting elements, and the second pixel circuits are electrically connected with the second light emitting elements.

In an exemplary implementation mode, spacing between the first light emitting elements is greater than spacing between the second light emitting elements; and/or, an area of the first light emitting elements is less than an area of the second light emitting elements.

In an exemplary implementation mode, the second display area has 3 or 4 second light emitting elements arranged in a direction away from the first display area.

In an exemplary implementation mode, an orthographic projection of the first polarizing structure on the base substrate overlaps with an orthographic projection of the 3 or 4 second light emitting elements on the base substrate.

In an exemplary implementation mode, the display substrate further includes a light absorption layer, the light absorption layer is located at least in the first display area and the second display area, and the light absorption layer is stacked between the first polarizing structure and the first reflective interface.

In an exemplary implementation mode, the display substrate further includes a light shielding layer, the light shielding layer is located in the second display area, an orthographic projection of the light shielding layer on the base substrate does not overlap with the first display area, and the light shielding layer is stacked on a side of the pixel circuit layer close to the base substrate.

In another aspect, the present disclosure further provides a display device including any display substrate described above, and a photosensitive sensor located on a side away from a light exit side of the display substrate, and an orthographic projection of the photosensitive sensor on the display substrate overlaps with the first display area in the display substrate.

In another aspect, the present disclosure further provides a method for manufacturing a display substrate, the display substrate includes a first display area and a second display area, the second display area is located on at least one side of the first display area, and the first display area is an under-screen sensing region; the method for manufacturing the display substrate includes:

forming a base substrate in at least the first display area and the second display area;

forming a pixel circuit layer on at least the base substrate of the second display area;

forming a first reflective interface at least on a side of the base substrate away from the pixel circuit layer, wherein the first reflective interface is located at least in the first display area and the second display area; the first reflective interface reflects at least part of light toward the pixel circuit layer; and forming a first polarizing structure at least between the base substrate and the first reflective interface, wherein at least part of the first polarizing structure is located in the second display area, and the first polarizing structure is configured to block incidence of light reflected by the first reflective interface on the pixel circuit layer.

Other aspects will become apparent upon reading and understanding of the accompanying drawings and the detailed description.

BRIEF DESCRIPTION OF DRAWINGS

Accompanying drawings are used for providing an understanding for technical solutions of the present application and form a part of the specification, are used for explaining the technical solutions of the present application together with embodiments of the present application, and do not constitute a limitation on the technical solutions of the present application.

FIG. 2D is another sectional view of a display substrate according to an embodiment of the present disclosure.

FIG. 2E is another sectional view of a display substrate according to an embodiment of the present disclosure.

FIG. 3 is a schematic diagram of a display device according to an embodiment of the present disclosure.

DETAILED DESCRIPTION

Figure 1A:
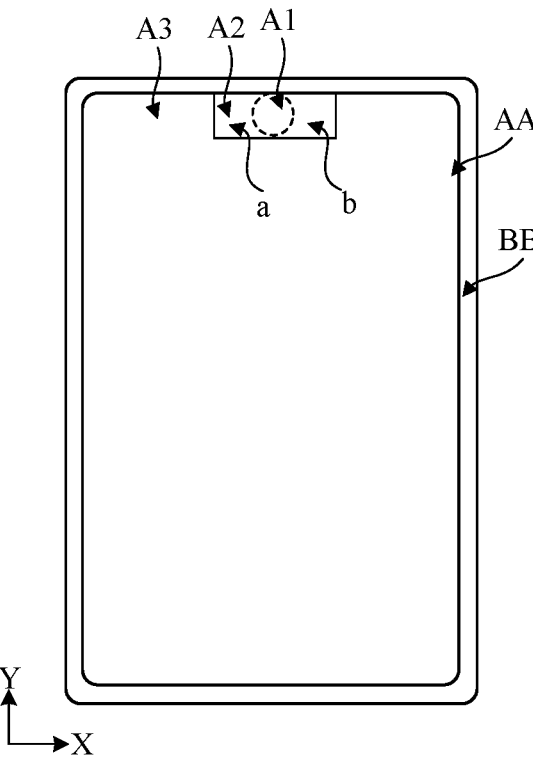
FIG. 1A is a schematic diagram of a display substrate according to an embodiment of the present disclosure.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation mode of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integral connection. It may be a mechanical connection or an electrical connection. It may be a direct mutual connection, or an indirect connection through middleware, or an internal communication between two components. Those of ordinary skills in the art may understand specific meanings of these terms in the present disclosure according to specific situations.

In the specification, a transistor refers to an element which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

Figure 4:
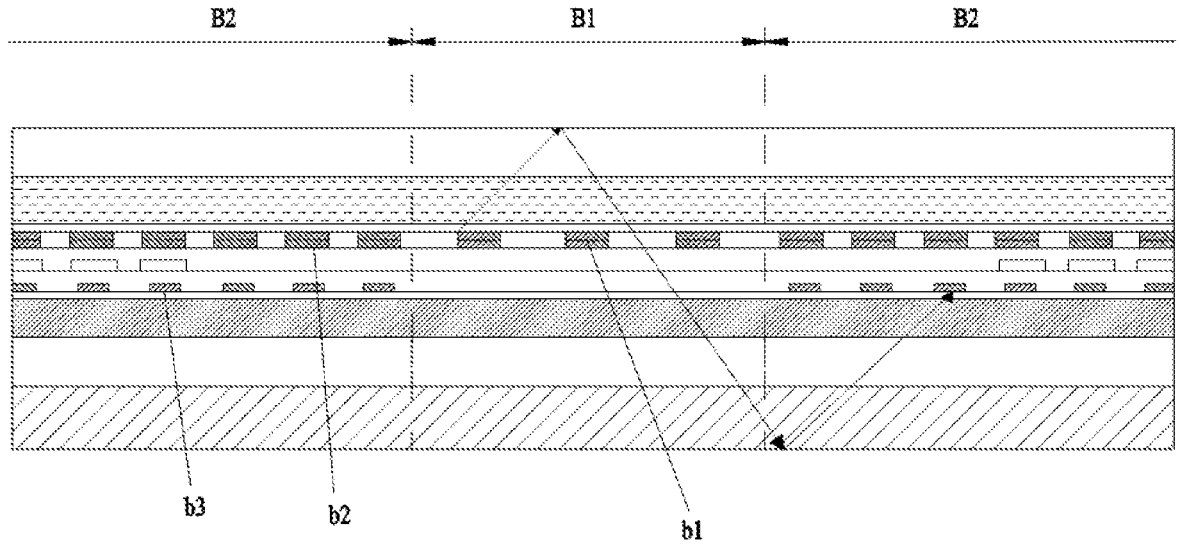
FIG. 4 is a schematic diagram of a display substrate in the related art.

FIG. 4 is a schematic diagram of a display substrate in the related art. As shown in FIG. 4, the display substrate in the related art includes an under-screen sensing region B1 and a display region B2 located on a peripheral side of the under-screen sensing region B1, for example, the under-screen sensing region is an under-screen sensing camera (Full Display with Camera, FDC) region B1. The under-screen sensing region B1 includes a base substrate and multiple first light emitting elements b1 provided on the base substrate, and the display region B2 includes a base substrate and multiple second light emitting elements b2 provided on the base substrate and a pixel circuit layer b3. The multiple second light emitting elements b2 are located on a side of the pixel circuit layer b3 away from the base substrate.

According to the research of the inventor of the present application, it is found that light emitted by the first light emitting elements b1 in the under-screen sensing region B1 will be reflected on an inner film layer of the display substrate and irradiate the pixel circuit layer b3 in the display region B2, causing a characteristics positive deviation of the pixel circuit layer b3, making the second light emitting elements b2 emit light, radiating an area of about 3~4 second light emitting elements b2, resulting in undesirable phenomena such as dark rings, which will affect the display effect. Herein, the dark rings gradually decay in a direction away from the sensing region B1.

The inventor of the present application blackens a backlight side of the under-screen sensing region B1, so that the light intensity received by the second light emitting element b2 of the display region B2 is reduced, and the dark ring response is reduced by about 38%.

An embodiment of the present disclosure provides a display substrate, including a first display area and a second display area, wherein the second display area is located on at least one side of the first display area, and the first display area is an under-screen sensing region. The display substrate at least includes:

a base substrate at least located in the first display area and the second display area;

a pixel circuit layer, wherein at least part of the pixel circuit layer is located in the second display area and on a side of the base substrate;

a first reflective interface located at least in the first display area and the second display area and located on the side of the base substrate away from the pixel circuit layer; the first reflective interface reflects at least part of light toward the pixel circuit layer; and a first polarizing structure, wherein at least part of the first polarizing structure is located in the second display area, and at least part of the first polarizing structure is located between the base substrate and the first reflective interface, the first polarizing structure is configured to block the incidence of light reflected by the first reflective interface onto the pixel circuit layer.

Solutions of the embodiment will be described below through some examples.

Figure 1B:
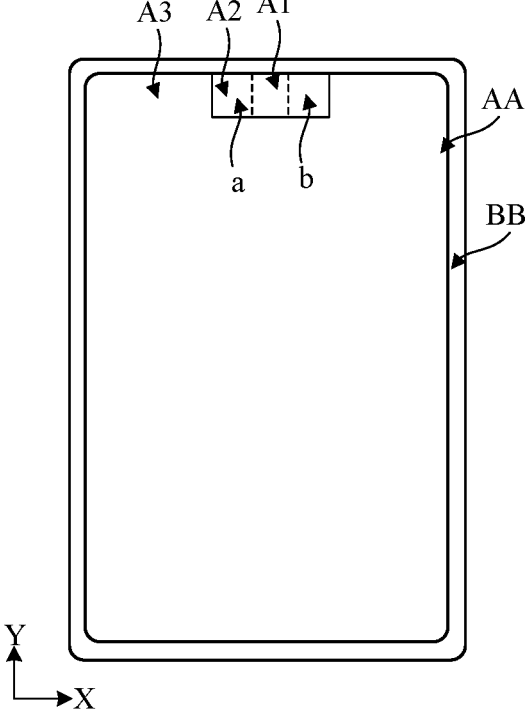
FIG. 1B is another schematic diagram of a display substrate according to an embodiment of the present disclosure.

FIG. 1A is a schematic diagram of a display substrate according to an embodiment of the present disclosure. FIG. 1B is another schematic diagram of a display substrate according to an embodiment of the present disclosure. In an exemplary implementation mode, as shown in FIGS. 1A and 1B, the display substrate includes a display region AA and a bezel region BB located around the display region AA. The display region AA may include a first display area A1, a second display area A2, and a third display area A3. The second display area A2 may be located on at least one side of the first display area A1. The third display area A3 is located on at least one side of the first display area A1 and the second display area A2. An area within the display region AA other than the first display area A1 and the second display area A2 is the third display area A3. Herein, the first display area A1 can also be referred as an under-screen sensing region, such as an under-screen camera (FDC, Full Display with Camera) region, the second display area A2 may also be referred as a buffer area, and the third display area A3 may also be referred as a normal display area. However, this embodiment is not limited thereto.

In an exemplary implementation mode, as shown in FIGS. 1A and 1B, the first display area A1 and the second display area A2 may be located directly in the middle of the top of the display substrate. However, this embodiment is not limited thereto. For example, the first display area A1 and the second display area A2 may be located at other positions, such as the upper left corner or the upper right corner of the display substrate.

In an exemplary implementation mode, as shown in FIGS. 1A and 1B, the second display area A2 may be located on opposite sides of the first display area A1 in a first direction X. However, this embodiment is not limited thereto. For example, the second display area may be located on a side of the first display area in a first direction, or may be located on at least one side of the first display area in a second direction.

In an exemplary implementation mode, as shown in FIGS. 1A and 1B, the display region AA may be in a shape of a rectangle, e.g., a rounded rectangle. As shown in FIG. 1A, the first display area A1 may be circular or elliptical. As shown in FIG. 1B, the first display area A1 may be rectangular. However, this embodiment is not limited thereto. For example, the first display area may be in other shapes, such as quadrangle or pentagon.

In an exemplary implementation mode, the first display area A1 may also be referred to as an under-screen sensing region which may be a light-transmissive display region. An orthographic projection of hardware such as a photosensitive sensor (e.g., a camera) on the display substrate may be located within the first display area A1 of the display substrate. In this example, the display substrate does not need to be punched, and under a premise of ensuring practicability of the display substrate, a true full screen can be realized. In some examples, as shown in FIG. 1A, the first display area A1 may be circular and a size of the orthographic projection of the photosensitive sensor on the display substrate may be less than or equal to a size of the first display area A1. In some other examples, as shown in FIG. 1B, the first display area A1 may be rectangular, and a size of the orthographic projection of the photosensitive sensor on the display substrate may be less than or equal to a size of an inscribed circle of the first display area A1. However, this embodiment is not limited thereto.

In an exemplary implementation mode, the display substrate may include multiple sub-pixels provided on the base substrate, and at least one sub-pixel may include a pixel circuit and a light emitting element. The pixel circuit is configured to drive the light emitting element. For example, the pixel circuit is configured to provide a drive current for driving the light emitting element to emit light. For example, the light emitting element may be an Organic Light Emitting Diode (OLED), and the light emitting element emits red light, green light, blue light, or white light, etc. under drive of its corresponding pixel circuit. A color of light emitted from the light emitting element may be determined as required.

In some exemplary embodiments, in order to improve a light transmittance of the first display area A1, it is possible to arrange only the light emitting elements in the first display area A1, and arrange the pixel circuits for driving the light emitting element of the first display area A1 in the second display region A2. That is, a light transmittance of the first display area A1 is improved by separately arranging the light emitting elements and the pixel circuits. In this example, in the first display area A1, no pixel circuit is provided.

A pixel circuit may also be provided in the first display area A1. For example, island-shaped pixel circuits are provided in the first display area A1, and the number of pixel circuits in a unit area (for example, 1000 square microns) of the first display area A1 is less than the number of pixel circuits in the third display area A3.

Optionally, an area of the first light emitting elements 21 in the first display area A1 is less than an area of the second light emitting elements 22 and/or the third light emitting elements 23. For example, an area of the first light emitting element 21 (e.g., red R) of at least one color of the first display area A1 is less than an area of the second light emitting element 22 (e.g., red R) and/or an third light emitting element 23 (e.g., red R) of the corresponding color.

Optionally, spacing between the first light emitting elements 21 of the first display area A1 is larger than spacing between the second light emitting elements 22 of the second display area A2; and/or spacing between the first light emitting elements 21 of the first display area A1 is larger than spacing between the third light emitting elements 23 of the third display area A3.

Optionally, a shape of the first light emitting elements 21 of the first display area A1 is different from a shape of the second light emitting elements 22 and/or the third light emitting elements 23. For example, the first light emitting elements 21 of the first display area A1 are circular and the second light emitting elements 22 and/or the third light emitting elements 23 are rectangular.

Figure 2A:
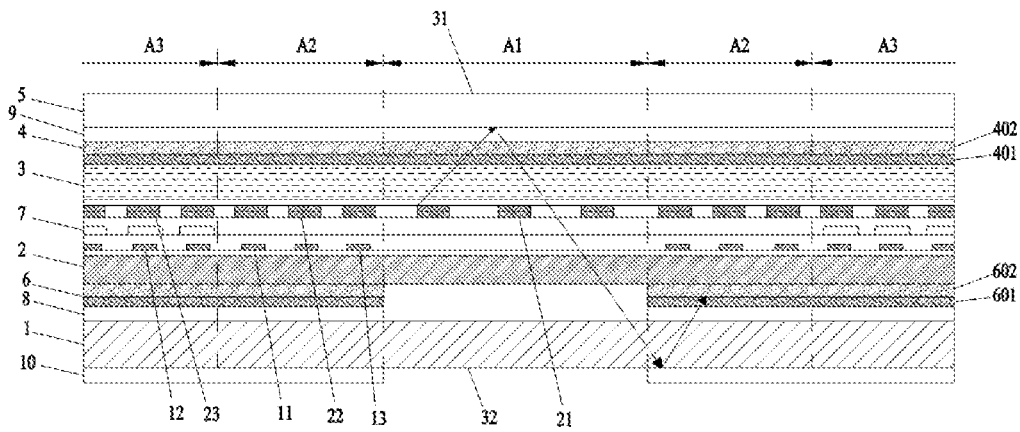
FIG. 2A is a sectional view of a display substrate according to an embodiment of the present disclosure.
Figure 2B:
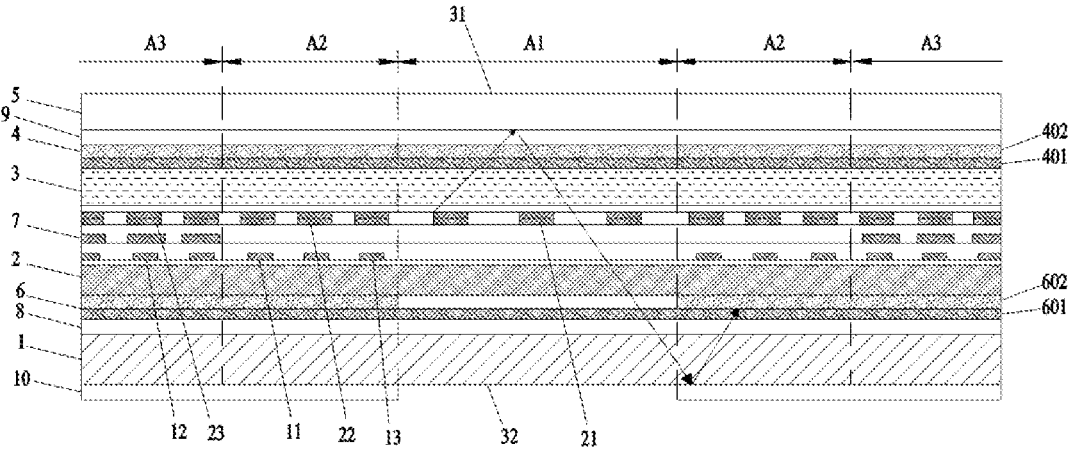
FIG. 2B is another sectional view of a display substrate according to an embodiment of the present disclosure.
Figure 2C:
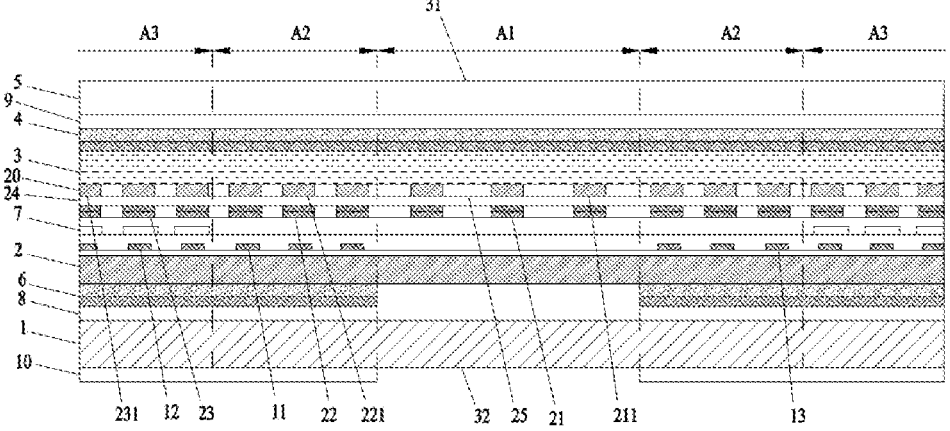
FIG. 2C is another sectional view of a display substrate according to an embodiment of the present disclosure.

FIG. 2C is another sectional view of a display substrate according to an embodiment of the present disclosure. In an exemplary implementation mode, as shown in FIG. 2C, the display substrate according to the embodiment of the present disclosure includes a base substrate 2 and multiple first light emitting elements 21, multiple second light emitting elements 22 and multiple third light emitting elements 23 provided on the base substrate 2. The multiple first light emitting elements 21 are located in the first display area A1, the multiple second light emitting elements 22 are located in the second display area A2, and the multiple third light emitting elements 23 are located in the third display area A3. Quantum dot structures 20 of corresponding colors may be provided above or below corresponding positions of the first light emitting elements 21, the second light emitting elements 22 and the third light emitting elements 23. Exemplarily, red quantum dot elements are provided above red light emitting elements (R) of the first light emitting elements 21, the second light emitting elements 22, and the third light emitting elements 23. For example, the quantum dot structures 20 includes multiple first quantum dot elements 211, multiple second quantum dot elements 221 and multiple third quantum dot elements 231. The multiple first quantum dot elements 211 are disposed in one-to-one correspondence with the multiple first light emitting elements 21, the first quantum dot elements 211 are located on a side of the first light emitting elements 21 away from the base substrate, and an orthographic projection of at least part of the first quantum dot elements 211 on the base substrate 2 overlaps an orthographic projection of the first light emitting elements 21 on the base substrate 2. The multiple second quantum dot elements 221 are disposed in one-to-one correspondence with the multiple second light emitting elements 22, the second quantum dot elements 221 are located on a side of the second light emitting elements 22 away from the base substrate, and an orthographic projection of at least part of the second quantum dot elements 221 on the base substrate 2 overlaps an orthographic projection of the second light emitting elements 22 on the base substrate 2. The multiple third quantum dot elements 231 are disposed in one-to-one correspondence with the multiple third light emitting elements 23, the third quantum dot elements 231 are located on a side of the third light emitting elements 23 away from the base substrate, and an orthographic projection of at least part of the third quantum dot elements 231 on the base substrate 2 overlaps an orthographic projection of the third light emitting elements 23 on the base substrate 2.

Optionally, the number of quantum dot elements in a unit area (e.g., 1000 square microns) in the first display area A1 is less than the number of quantum dot elements in a unit area (e.g., 1000 square microns) in the second display area A2; and/or, the number of quantum dot elements in a unit area (e.g., 1000 square microns) in the first display area A1 is less than the number of quantum dot elements in a unit area (e.g., 1000 square microns) in the third display area A3.

Optionally, an area of the first quantum dot elements 211 of the first display area A1 is less than an area of the second quantum dot elements 221 of the second display area A2 and/or the third quantum dot elements 231 of the third display area A3. Optionally, spacing between the first quantum dot elements 211 of the first display area A1 is larger than the spacing between the second quantum dot elements 221 of the second display area A2; and/or spacing between the first quantum dot elements of the first display area A1 is larger than spacing between the third quantum dot elements 231 of the third display area.

Optionally, a shape of the first quantum dot elements 211 of the first display area A1 is different from a shape of the second quantum dot elements 221 and/or the third quantum dot elements 231. For example, the first quantum dot elements 211 of the first display area A1 are circular and the second quantum dot elements 221 and/or the third quantum dot elements 231 are rectangular.

In an exemplary implementation mode, materials of the first quantum dot elements 211, the second quantum dot elements 221, and the third quantum dot elements 231 may include a Group II-VI compound, a Group II-IV compound, a Group IV-VI compound, a Group IV compound, or a combination thereof.

In an exemplary implementation mode, as shown in FIG. 2C, the display substrate according to the embodiment of the present disclosure further includes an insulating layer 24. The insulating layer 24 is located between the quantum dot structures 20 and the multiple first light emitting elements 21, the multiple second light emitting elements 22, and the multiple third light emitting elements 23 for isolating the quantum dot structures 20 from the multiple first light emitting elements 21, the multiple second light emitting elements 22, and the multiple third light emitting elements 23 respectively.

In an exemplary implementation mode, as shown in FIG. 2C, the quantum dot structures 20 in the display substrate according to the embodiment of the present disclosure further includes a black matrix 25. The black matrix 25 is located between the first quantum dot elements 211 in the first display area A1, between the second quantum dot elements 221 in the second display area A2, and between the third quantum dot elements 231 in the third display area A3.

FIG. 2A is a sectional view of a display substrate according to an embodiment of the present disclosure. In an exemplary implementation mode, as shown in FIG. 2A, in a plane perpendicular to the display substrate, the display substrate may include multiple first light emitting elements 21, multiple second light emitting elements 22, multiple third light emitting elements 23, multiple first pixel circuits 13, multiple second pixel circuits 11, and multiple third pixel circuits 12. The multiple first light emitting elements 21 are located in the first display area A1, the multiple second light emitting elements 22, the multiple first pixel circuits 13 and the multiple second pixel circuits 11 are located in the second display area A2, and the multiple third light emitting elements 23 and the multiple third pixel circuits 12 are located in the third display area A3. The first display area A1 may also be referred to as an under-screen sensing region, which may be a light-transmissive display region. The second display area A2 may also be referred to as a buffer area. The third display area A3 may also be referred to as a normal display area. Structures of the first pixel circuits 13, structures of the second pixel circuits 11 and structures of the third pixel circuits 12 may be the same. A size of a first pixel circuit 13, a size of a second pixel circuit 11 and a size of a third pixel circuit 12 may be the same.

In an exemplary implementation mode, as shown in FIG. 2A, at least one first pixel circuit 13 is electrically connected with at least one first light emitting element 21. For example, one first pixel circuit 13 is electrically connected with two first light emitting elements 21 through conductive lines. An orthographic projection of the first pixel circuit 13 on the base substrate may not overlap with an orthographic projection of the electrically connected first light emitting elements 21 on the base substrate. At least one second pixel circuit 11 is electrically connected with at least one second light emitting element 22. An orthographic projection of the at least one second pixel circuit 11 on the base substrate at least partially overlaps with an orthographic projection of the at least one second light emitting element 22 on the base substrate. For example, one second pixel circuit 11 is electrically connected with two second light emitting elements 22. An orthographic projection of the second pixel circuit 11 on the base substrate may overlap with an orthographic projection of the electrically connected second light emitting elements 22 on the base substrate. At least one third pixel circuit 12 is electrically connected with at least one third light emitting element 23. An orthographic projection of the at least one third pixel circuit 12 on the base substrate at least partially overlaps with an orthographic projection of the at least one third light emitting element 23 on the base substrate. For example, the multiple third pixel circuits 12 are electrically connected with the multiple third light emitting elements 23 in one-to-one correspondence. An orthographic projection of the third pixel circuits 12 on the base substrate overlaps with an orthographic projection of the electrically connected third light emitting elements 23 on the base substrate.

In some embodiments at least one first pixel circuit may be electrically connected with at least one first light emitting element 21 and at least one second light emitting element 22. For example, one first pixel circuit 13 is electrically connected with one first light emitting element 21 and one second light emitting element 22 respectively through conductive lines. At least one second pixel circuit may be electrically connected with at least one first light emitting element 21 and at least one second light emitting element 22. For example, one second pixel circuit 13 is electrically connected with one first light emitting element 21 and one second light emitting element 22 respectively through conductive lines.

In an exemplary implementation mode, the first pixel circuits of the second display area A2 may be electrically connected with the first light emitting elements 21 through conductive lines. The conductive lines may extend from the second display area A2 to the first display area A1. One end of each conductive line may be electrically connected with a first pixel circuit in the second display area A2, and the other end of the conductive line may be electrically connected with a first light emitting element 21 in the first display area A1, thereby achieving an electrical connection between the first pixel circuit and the first light emitting element 21. In some examples, the conductive lines may be made of a transparent conductive material. For example, the conductive line may be made of a conductive oxide material. For example, the conductive oxide material may include Indium Tin Oxide (ITO). However, this embodiment is not limited thereto.

In an exemplary implementation mode, as shown in FIG. 2A, the first display area A1 is not provided with a pixel circuit, and the second display area A2 is provided with multiple first pixel circuits and multiple second pixel circuits 11. The first pixel circuits may supply drive signals to the first light emitting elements 21 of the first display area A1 to drive the first light emitting elements 21 to emit light. The second pixel circuits 11 may supply drive signals to the second light emitting elements 22 of the second display area A2 to drive the second light emitting elements 22 to emit light. The third pixel circuits 12 provided in the third display area A3 may supply drive signals to the third light emitting elements 23 of the third display area A3 to drive the third light emitting elements 23 to emit light.

In an exemplary implementation mode, the first display area A1 is a light-transmissive display region, and the second display area A2 and the third display area A3 are non-light-transmissive display regions. That is, the first display area A1 can transmit light, and the light transmittance of the second display area A2 and the light transmittance of the third display area A3 are less than that of the first display area A1. The light transmittance of the third display area A3 may be less than that of the second display area A2 and less than that of the first display area A1. In this way, there is no need to drill a hole on the display substrate, and a required hardware structure such as a photosensitive sensor may be directly disposed below the first display area, which lays a solid foundation for realization of a true full screen. In addition, since only light emitting elements are included in the first display area A1, and no pixel circuit is included, it is also possible to ensure that the light transmittance of the first display area A1 is good.

Figure 5A:
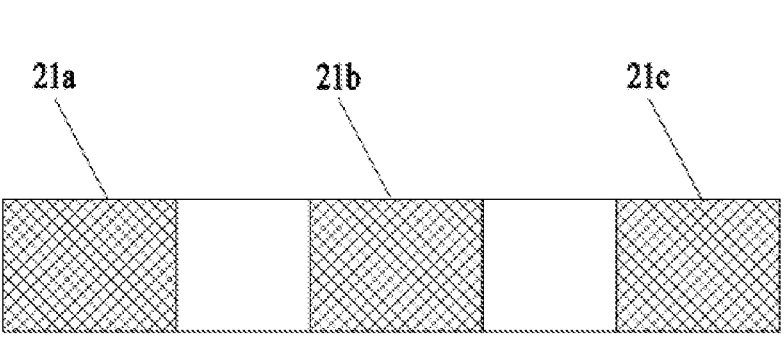
FIG. 5A is a first top view of a light emitting element of a first display area in a display substrate according to the present disclosure.
Figure 5B:
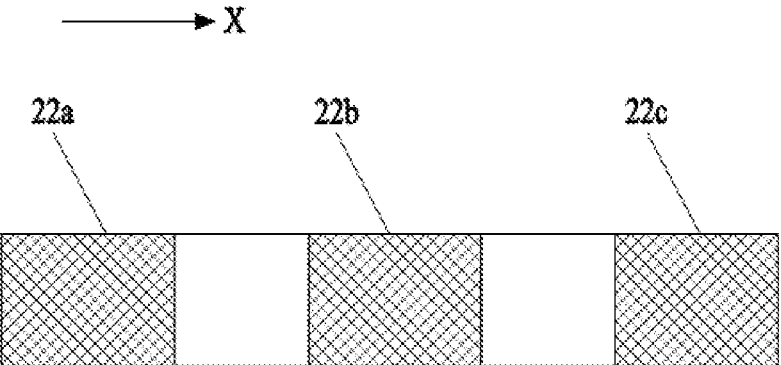
FIG. 5B is a top view of a light emitting element of a second display area in a display substrate according to the present disclosure.
Figure 5C:
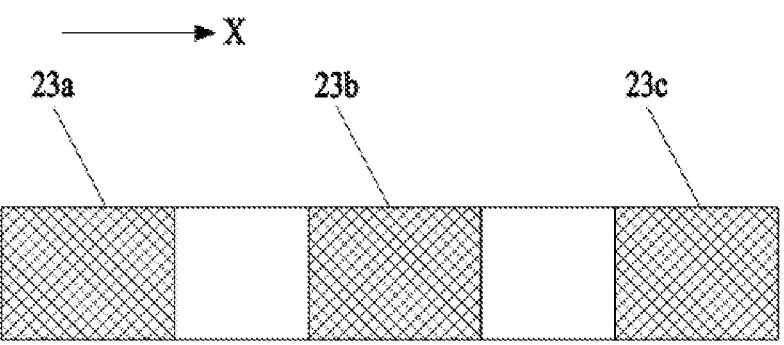
FIG. 5C is a top view of a light emitting element of a third display area in a display substrate according to the present disclosure.

FIG. 5A is a first top view of light emitting elements of a first display area in a display substrate according to the present disclosure. FIG. 5B is a top view of light emitting elements of a second display area in a display substrate according to the present disclosure. FIG. 5C is a top view of light emitting elements of a third display area in a display substrate according to the present disclosure. In an exemplary implementation mode, the display region AA is provided with multiple pixel units. At least one pixel unit may include one green (G) light emitting element, one red (R) light emitting element, and one blue (B) light emitting element. One green light emitting element, one red light emitting element and one blue light emitting element are sequentially arranged in the first direction X. The light emitting elements in this example are arranged in RGB mode. For example, the first display area A1 is provided with multiple first pixel units, and a first pixel unit may include one green (G) first light emitting element 21a, one red (R) first light emitting element 21b, and one blue (B) first light emitting element 21c. One green first light emitting element 21a, one red first light emitting element 21b and one blue first light emitting element 21c are sequentially arranged the first direction X, as shown in FIG. 5A. The second display area A2 is provided with multiple second pixel units, and a second pixel unit may include one green (G) second light emitting element 22a, one red (R) second light emitting element 22b, and one blue (B) second light emitting element 22c. One green second light emitting element 22a, one red second light emitting element 22b, and one blue second light emitting element 22c are sequentially arranged in the first direction X, as shown in FIG. 5B. The third display area A3 is provided with multiple third pixel units, and a third pixel unit may include one green (G) third light emitting element 23a, one red (R) third light emitting element 23b, and one blue (B) third light emitting element 23c. One green third light emitting element 23a, one red third light emitting element 23*b* and one blue third light emitting element 23*c* are sequentially arranged in the first direction X, as shown in FIG. 5C.

Figure 5D:
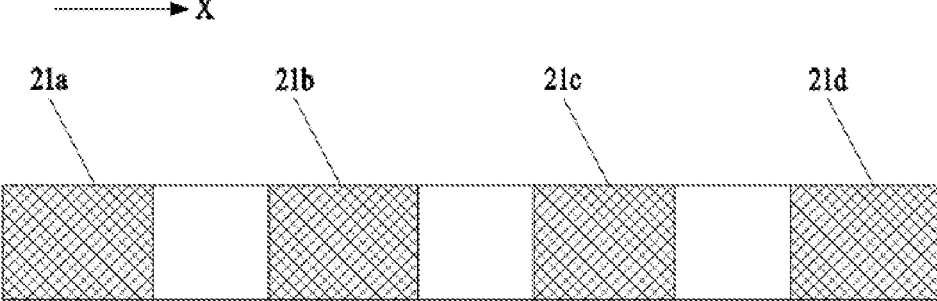
FIG. 5D is a second top view of a light emitting element of a first display area in a display substrate according to the present disclosure.

FIG. 5D is a second top view of a light emitting element of a first display area in a display substrate according to the present disclosure. However, this embodiment is not limited thereto. In some examples, one pixel unit may include other colors as well as other numbers of light emitting elements. For example, the first display area A1 is provided with multiple first pixel units, and a first pixel unit may include: one green (G) first light emitting element 21*a*, one red (R) first light emitting element 21*b*, one blue (B) first light emitting element 21*c* and one white first light emitting element 21*d*, and one green (G) first light emitting element 21*a*, one red (R) first light emitting element 21*b*, one blue (B) first light emitting element 21*c*, and one white first light emitting element 21*d* may be arranged side by side horizontally, side by side vertically, or in a triangle arrangement. As an example, one green (G) first light emitting element 21*a*, one red (R) first light emitting element 21*b*, one blue (B) first light emitting element 21*c*, and one white first light emitting element 21*d* are arranged side by side horizontally, as shown in FIG. 5D. However, this embodiment is not limited thereto.

In an exemplary implementation mode, as shown in FIG. 2A, in a plane perpendicular to the display substrate, the display substrate may include:

a base substrate 2 located in the first display area A1, the second display area A2 and the third display area A3;

a pixel circuit layer including multiple first pixel circuits 13, multiple second pixel circuits 11, and multiple third pixel circuits 12, wherein the multiple first pixel circuits 13 and the multiple second pixel circuits 11 are located in the second display area A2 and are located on a side of the base substrate 2; the multiple third pixel circuits 12 are located in the third display area A3 and on a side of the base substrate 2;

multiple first light emitting elements 21, multiple second light emitting elements 22 and multiple third light emitting elements 23, wherein the multiple first light emitting elements 21 are located in the first display area and on a side of the base substrate 2; the multiple second light emitting elements 22 are located in the second display area A2 and on a side of the pixel circuit layer away from the base substrate 2; the multiple third light emitting elements 23 are located in the third display area A3 and on the side of the pixel circuit layer away from the base substrate 2;

an encapsulation layer 3, wherein the encapsulation layer 3 is located in the first display area A1, the second display area A2 and the third display area A3 and located on a side of the multiple first light emitting elements 21, the multiple second light emitting elements 22 and the multiple third light emitting elements 23 away from the base substrate 2 and covering the multiple first light emitting elements 21, the multiple second light emitting elements 22 and the multiple third light emitting elements 23;

a second polarizing structure 4, wherein the second polarizing structure 4 is located in the first display area A1, the second display area A2 and the third display area A3 and located on a side of the encapsulation layer 3 away from the base substrate 2;

a cover plate 5, wherein the cover plate 5 is located in the first display area A1, the second display area A2 and the third display area A3 and located on a side of the second polarizing structure 4 away from the base substrate 2;

a first polarizing structure 6, wherein the first polarizing structure 6 is located in the second display area A2 and the third display area A3 and located on a side of the base substrate 2 away from the pixel circuit layer;

a back plate 1, wherein the back plate 1 is located in the first display area A1, the second display area A2 and the third display area A3 and located on a side of the first polarizing structure 6 away from the base substrate 2; and a first reflective interface 32, wherein the first reflective interface 32 is located in the first display area A1, the second display area A2 and the third display area A3 and located at least on the side of the base substrate 2 away from the pixel circuit layer, the first reflective interface reflects at least part of light toward the pixel circuit layer; the first polarizing structure 6 is configured to block the incidence of light reflected by the first reflective interface onto the pixel circuit layer. For example, the first polarizing structure 6 is configured to block the incidence of light entered from the first display area A1 and reflected by the first reflective interface onto the pixel circuit layer.

In an exemplary implementation mode, as shown in FIG. 2A, in the display substrate according to the embodiment of the present disclosure, a first reflective interface 32 is formed at the interface between a surface of the back plate 1 away from the base substrate 2 and an outer side the display substrate. In some embodiments, a second reflective interface may also be formed at an interface between other film layers located on a side of the second polarizing structure away from the base substrate in the display substrate according to an embodiment of the present disclosure, and a first reflective interface may also be form on an interface of other film layers located on a side of the first polarizing structure away from the base substrate in the display substrate according to an embodiment of the present disclosure. However, this embodiment is not limited thereto.

In an exemplary implementation mode, as shown in FIG. 2A, in a plane perpendicular to the display substrate, the first display area A1 may include: the back plate 1, the base substrate 2 provided on a side of the back plate 1, multiple first light emitting elements 21 provided on a side of the base substrate 2 away from the back plate 1, the encapsulation layer 3 provided on a side of the first light emitting elements 21 away from the back plate 1, the second polarizing structure 4 provided on a side of the encapsulation layer 3 away from the back plate 1, and the cover plate 5 provided on a side of the second polarizing structure 4 away from the back plate 1. The first display area A1 is not provided with a pixel circuit layer or a first polarizing structure, and an orthographic projection of the first polarizing structure on the base substrate 2 does not overlap with the first display area A1.

As shown in FIG. 2A, in a plane perpendicular to the display substrate, the second display area A2 may include: the back plate 1, the first polarizing structure 6 provided on the back plate 1, the base substrate 2 provided on a side of the first polarizing structure 6 away from the back plate 1, the pixel circuit layer provided on a side of the base substrate 2 away from the back plate 1, multiple second light emitting elements 22 provided on a side of the pixel circuit layer away from the back plate 1, the encapsulation layer 3 provided on a side of the multiple second light emitting elements 22 away from the back plate 1, the second polarizing structure 4 provided on a side of the encapsulation layer 3 away from the back plate 1, and the cover plate 5 provided on a side of the second polarizing structure 4 away from the back plate 1. The pixel circuit layer includes multiple first pixel circuits and multiple second pixel circuits 11. The second display area A2 is provided with a pixel circuit layer and the first polarizing structure 6.

As shown in FIG. 2A, in a plane perpendicular to the display substrate, the third display area A3 may include: the back plate 1, the first polarizing structure 6 provided on the back plate 1, the base substrate 2 provided on a side of the first polarizing structure 6 away from the back plate 1, the pixel circuit layer provided on a side of the base substrate 2 away from the back plate 1, a trace layer provided on a side of the pixel circuit layer away from the back plate 1, multiple third light emitting elements 23 provided on a side of the trace layer away from the back plate 1, the encapsulation layer 3 provided on a side of the multiple third light emitting elements 23 away from the back plate 1, the second polarizing structure 4 provided on a side of the encapsulation layer 3 away from the back plate 1, and the cover plate 5 provided on a side of the second polarizing structure 4 away from the back plate 1. Herein, the pixel circuit layer includes multiple third pixel circuits 12. The trace layer includes multiple signal traces 7. The third display area A3 is provided with the pixel circuit layer, the trace layer and the first polarizing structure 6. Herein, the signal traces 7 may include at least one of a scan line, a data signal line, a ground line, a first drive line and a second drive line.

In an exemplary implementation mode, as shown in FIG. 2A, in a plane perpendicular to the display substrate, the first display area A1 is not provided with a pixel circuit layer, a first polarizing structure, and a trace layer, so that it can be ensured that a light transmittance of the first display area A1 is good. The second display area A2 is provided with the pixel circuit layer and the first polarizing structure, and is not provided with a trace layer. The third display area A3 is provided with the pixel circuit layer, the trace layer and the first polarizing structure.

In an exemplary implementation mode, as shown in FIGS. 1A and 1B, in a plane parallel to the display substrate, the second display area A2 is provided with 3 or 4 second light emitting elements 22 in a direction away from the first display area A1. For example, the second display area A2 may include a first region a and a second region b in the first direction X, wherein the first region a and the second region b are located on two sides of the first display area A1 in the first direction X, The first region a and the second region b each include one green (G) second light emitting element, one red (R) second light emitting element and one blue (B) second light emitting element, wherein the one green (G) second light emitting element, one red (R) second light emitting element and one blue (B) second light emitting element are arranged along the first direction X.

It is found by the inventor through research that a radiation area of dark rings is about 3 to 4 light emitting elements, and the dark rings gradually decay in a direction away from the first display area A1. By arranging 3 or 4 light emitting elements in the second display area A2 in the direction away from the first display area A1, the display substrate according to the embodiment of the present disclosure prevents the dark rings from extending to the third display area A3, thus avoiding affecting the display effect of the third display area A3.

In an exemplary implementation mode, as shown in FIGS. 1A and 1B, in a plane parallel to the display substrate, the first polarizing structure 6 may be located only in the second display area A2, an orthographic projection of the first polarizing structure 6 on the base substrate 2 overlaps with the second display area A2, and an orthographic projection of the first polarizing structure 6 on the base substrate 2 overlaps with neither the first display area A1 nor the third display area A3. The first polarizing structure 6 covers at least 3 or 4 light emitting elements arranged in the second display area A2 in the direction away from the first display area A1. For example, the first polarizing structure 6 is located in the first region a and the second region b of the second display area A2.

FIG. 2D is another sectional view of a display substrate according to an embodiment of the present disclosure. In an exemplary implementation mode, as shown in FIG. 2D, the display substrate according to the embodiment of the present disclosure further includes a light absorption layer 40. The light absorption layer 40 is located in the first display area A1, the second display area A2, and the third display area A3, and the light absorption layer 40 is stacked between the first polarizing structure 6 and the first reflective interface 32, for example, the light absorption layer 40 is stacked between the first polarizing structure 6 and the back plate 1. The light absorption layer 40 is configured to absorb light emitted toward the first reflective interface 32. The light absorption layer 40 has a function of absorbing light, and can reduce light emitted towards the first reflective interface 32, so that light reflected from the first reflective interface 32 to the pixel circuit layer is reduced, and further, occurrence of undesirable phenomena such as dark rings is avoided.

FIG. 2E is another sectional view of a display substrate according to an embodiment of the present disclosure. In an exemplary implementation mode, as shown in FIG. 2E, the display substrate according to the embodiment of the present disclosure further includes a light shielding layer 50. The light shielding layer 50 is located in the second display area A2 and the third display area A3, and the light shielding layer 50 is stacked on a side of the pixel circuit layer close to the base substrate 2. The light shielding layer 50 shields light of the second display area A2 and the third display area A3. The light shielding layer 50 is not located in the first display area A1, and an orthographic projection of the light shielding layer 50 on the base substrate 2 does not overlap with the first display area A1, so as to avoid shielding light of the first display area A1 and affecting the light transmittance of the first display area A1.

In an exemplary implementation mode, the light shielding layer 50 is formed in a mesh structure and includes a pattern area and a hollowed-out area, wherein an orthographic projection of the pattern area of the light shielding layer 50 on the base substrate 2 overlaps with an orthographic projection of a pixel circuit on the base substrate 2.

In some embodiments, the light shielding layer is formed in a mesh structure, and the light shielding layer may be located in the first display area A1, the second display area A2, and the third display area A3. An area of the hollowed-out area of the light shielding layer in the first display area A1 is larger than an area of the hollowed-out area of the light shielding layer in the second display area A2; and/or, the area of the hollowed-out area of the light shielding layer in the first display area A1 is larger than an area of the hollowed-out area of the light shielding layer in the third display area A3.

In an exemplary implementation mode, the base substrate 2 may be made of a material such as polyimide (PI), polyethylene terephthalate (PET), or a surface-treated polymer soft film.

In an exemplary implementation mode, a pixel circuit in a display substrate according to an embodiment of the present disclosure may include a transistor and a capacitor, and the transistor may include an active layer, a gate, a source, and a drain.

In an exemplary implementation mode, a light emitting element in a display substrate according to an embodiment of the present disclosure may be an OLED, a QLED, a Micro-LED, or a Mini-LED. The light emitting element may include an anode layer, a pixel definition layer, an organic light emitting layer, and a cathode layer. The organic light emitting layer may include a hole injection layer, a hole transport layer, a light emitting layer, an electron transport layer, and an electron injection layer that are stacked. In some examples, the cathode layer of the first display area A1, the cathode layer of the second display area A2 and the cathode layer of the third display area A3 may be in an integral structure. In this example, the cathode layer of the display region may be a full-surface cathode. For example, the cathode layer may be a transparent cathode, for example, may be manufactured from a transparent conductive material, such as ITO or IZO. In this example, the light emitting element may emit light from a side away from the base substrate through the transparent cathode, thus a top emission structure js realized. However, this embodiment is not limited thereto. For example, the cathode layer of the first display area A1 may be a patterned cathode with a hollowed-out region.

In an exemplary implementation mode, the encapsulation layer 3 in the display substrate according to the embodiment of the present disclosure may include a first encapsulation layer, a second encapsulation layer and a third encapsulation layer that are stacked. The first encapsulation layer is made of an inorganic material, the second encapsulation layer is made of an organic material, and the third encapsulation layer is made of an inorganic material, and covers the first encapsulation layer and the second encapsulation layer. However, this embodiment is not limited thereto. In some examples, the encapsulation layer may be in a five-layer structure of inorganic/organic/inorganic/organic/inorganic.

In an exemplary implementation mode, the display substrate according to an embodiment of the present disclosure further includes a first dielectric layer, a second dielectric layer, and a third dielectric layer, and the first dielectric layer, the second dielectric layer, and the third dielectric layer are sequentially stacked along a direction away from the base substrate 2. The first dielectric layer is located in the first display area A1, the second display area A2 and the third display area A3, and the first dielectric layer is stacked between the pixel circuit layer and the base substrate 2. The second dielectric layer is located in the first display area A1, the second display area A2 and the third display area A3, and the second dielectric layer is stacked between the pixel circuit layer and the trace layer. The third dielectric layer is located in the first display area A1, the second display area A2 and the third display area A3, and the third dielectric layer is stacked between the trace layer and the light emitting element. The first dielectric layer, the second dielectric layer, and the third dielectric layer may be made of an organic material, for example, a resin.

In an exemplary implementation mode, the display substrate according to the embodiment of the present disclosure further includes a first adhesive layer 8. The first adhesive layer 8 is located in the first display area A1, the second display area A2, and the third display area A3. In the second display area A2 and the third display area A3, the first adhesive layer 8 is stacked between the back plate 1 and the first polarizing structure 6. In the first display area A1, the first adhesive layer 8 is stacked between the back plate 1 and the base substrate 2. The first adhesive layer 8 is used for bonding the first polarizing structure 6 to the back plate 1 and bonding the base substrate 2 to the back plate 1. Here, the first adhesive layer 8 may be made of pressure sensitive adhesive (PSA).

In an exemplary implementation mode, the display substrate according to the embodiment of the present disclosure further includes a second adhesive layer 9 located in the first display area A1, the second display area A2 and the third display area A3, and the second adhesive layer 9 is stacked between the cover plate 5 and the second polarizing structure 4. The second adhesive layer 9 is used for bonding the cover plate 5 to the second polarizing structure 4. Herein, the second adhesive layer 9 may be made of optical adhesive (OCA).

In an exemplary implementation mode, as shown in FIG. 2A, the display substrate according to the embodiment of the present disclosure further includes a second reflective interface 31. The second reflective interface 31 is located in the first display area A1, the second display area A2, and the third display area A3, and at least on a side of the second polarizing structure 4 away from the base substrate 2. For example, the second reflective interface 31 is formed at the interface between a side of the cover plate 5 of the display substrate according to the embodiment of the present disclosure away from the base substrate 2 and an outer side of the display substrate.

In an exemplary implementation mode, as shown in FIG. 2A, the second reflective interface 31 makes light emitted by at least one first light emitting element 21 be formed as reflected light, for example, the light emitted by the at least one first light emitting element 21 is totally reflected at the second reflective interface 31 to form the above-mentioned reflected light emitted towards the second polarizing structure 4. The second polarizing structure 4 is configured to transmit the above-mentioned reflected light, form the transmitted reflected light into first circularly polarized light, and emit at least part of the first circularly polarized light toward the first reflective interface 32. The first reflective interface 32 forms the incident above-mentioned first circularly polarized light into second circularly polarized light and reflects at least part of the second circularly polarized light, so that at least part of the second circularly polarized light is emitted toward the first polarizing structure 6. The first polarizing structure 6 is configured to block transmission of the incident above-mentioned second circularly polarized light, thereby blocking the above-mentioned second circularly polarized light from being emitted to the first pixel circuits and the second pixel circuits 11 in the second display area A2, and the third pixel circuits 12 in the third display area A3, preventing the light emitted from the at least one first light emitting element 21 from being reflected by a film layer inside the display substrate and being incident to the pixel circuits in the display substrate, thereby avoiding characteristic deviation of the pixel circuits in the display substrate, improving undesirable phenomena such as dark rings on the display substrate and improving the display effect.

In an exemplary implementation mode, as shown in FIG. 2A, an optical path of the light in the display substrate according to the embodiment of the present disclosure is: the first light emitting elements 21 emit light, a part of the light is emitted out of the display substrate for displaying an image, and a part of the light is totally reflected at the second reflective interface 31 to form reflected light emitted towards the second polarizing structure 4. The reflected light is emitted to the second polarizing structure 4, the second polarizing structure 4 transmits at least part of the reflected light, forms the transmitted reflected light into first circularly polarized light, and emits at least part of the first circularly polarized light toward the first reflecting interface 32. At least part of the first circularly polarized light is emitted to the first reflective interface 32, and is totally reflected at the first reflective interface 32 to form second circularly polarized light emitted toward the first polarizing structure 6, the second circularly polarized light is blocked at the first polarizing structure 6 and cannot be transmitted through the first polarizing structure 6, thereby preventing the second circularly polarized light from being emitted to the first pixel circuits and the second pixel circuits 11 in the second display area A2 and the third pixel circuits 12 in the third display area A3, thereby avoiding characteristic deviation of the pixel circuits in the display substrate, improving undesirable phenomena such as dark ring on the display substrate and improving the display effect.

In an exemplary implementation mode, as shown in FIG. 2A, an orthographic projection of the second polarizing structure 4 on the base substrate 2 overlaps with an orthographic projection of the multiple first light emitting elements 21 on the base substrate 2, an orthographic projection of the multiple second light emitting elements 22 on the base substrate 2 and an orthographic projection of the multiple third light emitting elements 23 on the base substrate 2. At least part of the second polarizing structure 4 covers the multiple first light emitting elements 21, the multiple second light emitting elements 22 and the multiple third light emitting elements 23.

In some implementation modes, the second polarizing structure may be located only in the first display area A1 and not in the second display area A2 or the third display area A3. The orthographic projection of the second polarizing structure on the base substrate 2 overlaps with the orthographic projection of the multiple first light emitting elements 21 on the base substrate 2, and does not overlap with the orthographic projection of the multiple second light emitting elements 22 on the base substrate 2 and the orthographic projection of the multiple third light emitting elements 23 on the base substrate 2.

In an exemplary implementation mode, as shown in FIG. 2A, the second polarizing structure 4 includes a second phase difference film layer 401 and a second linear polarizing film layer 402 which are stacked. The second phase difference film layer 401 is located on a side of the second linear polarizing film layer 402 close to the base substrate 2, the second linear polarizing film layer 402 is configured to transmit reflected light and form the transmitted reflected light into first linearly polarized light, and the second phase difference film layer 401 is configured to transmit the first linearly polarized light and form the transmitted first linearly polarized light into first circularly polarized light. In some embodiments, the second phase difference film layer is configured to transmit the first linearly polarized light and form the transmitted first linearly polarized light into first elliptically polarized light. However, this embodiment is not limited thereto.

In an exemplary implementation mode, as shown in FIG. 2A, the orthographic projection of the first polarizing structure 6 on the base substrate 2 overlaps with the orthographic projection of the multiple second light emitting elements 22 on the base substrate 2 and the orthographic projection of the multiple third light emitting elements 23 on the base substrate 2, and does not overlap with the orthographic projection of the multiple first light emitting elements 21 on the base substrate 2.

In an exemplary implementation mode, as shown in FIG. 2A, the first polarizing structure 6 includes a first phase difference film layer 601 and a first linear polarizing film layer 602 which are stacked. The first linear polarizing film layer 602 is located on a side of the first phase difference film layer 601 close to the base substrate 2. The first phase difference film layer 601 is configured to transmit second circularly polarized light and form the transmitted second circularly polarized light into second linearly polarized light, and the first linear polarizing film layer 602 is configured to block transmission of the incident second linearly polarized light.

In an exemplary implementation mode, a light vector rotation direction of the first circularly polarized light is opposite to that of the second circularly polarized light. For example, the first circularly polarized light may be left-handed circularly polarized light and the second circularly polarized light may be right-handed circularly polarized light. Alternatively, the first circularly polarized light may be right-handed circularly polarized light and the second circularly polarized light may be left-handed circularly polarized light. However, this embodiment is not limited thereto.

In an exemplary implementation mode, a polarization direction of the second linearly polarized light is perpendicular to a polarization direction of the first linearly polarizing film layer 602, so that the second linearly polarized light cannot pass through the first linearly polarizing film layer 602, and further, the first polarizing structure 6 prevents the second circularly polarized light from being emitted to the first pixel circuits and the second pixel circuits 11 in the second display area A2, and the third pixel circuits 12 in the third display area A3, thereby avoiding characteristic deviation of the pixel circuits in the display substrate.

In an exemplary implementation mode, an included angle between the transmission axis of the second phase difference film layer 401 in the second polarizing structure 4 and a plane where the display substrate is located may be −5 degrees to 5 degrees. For example, the included angle between the transmission axis of the second phase difference film layer 401 and the plane where the display substrate is located may be 0 degree.

In an exemplary implementation mode, an included angle between the transmission axis of the first phase difference film layer 601 in the first polarizing structure 6 and the plane where the display substrate is located may be −5 degrees to 5 degrees. For example, the included angle between the transmission axis of the first phase difference film layer 601 and the plane where the display substrate is located may be 0 degrees.

In an exemplary implementation mode, the included angle between the transmission axis of the second phase difference film layer 401 and the plane where the display substrate is located may be the same as the included angle between the transmission axis of the first phase difference film layer 601 and the plane where the display substrate is located. For example, the included angle between the transmission axis of the second phase difference film layer 401 and the plane where the display substrate is located and the included angle between the transmission axis of the first phase difference film layer 601 and the plane where the display substrate is located may both be 0 degrees. However, this embodiment is not limited thereto. In some embodiments, the included angle between the transmission axis of the second phase difference film layer and the plane where the display substrate is located may also be different from the included angle between the transmission axis of the first phase difference film layer and the plane where the display substrate is located.

In an exemplary implementation mode, a phase difference of the second phase difference film layer 401 in the second polarizing structure 4 may be 60 nm to 450 nm. For example, the phase difference of the second phase difference film layer 401 in the second polarizing structure 4 may be 68.75 nm, 137.5 nm, 206.25 nm or 412.5 nm. However, this embodiment is not limited thereto.

In an exemplary implementation mode, the phase difference of the first phase difference film layer 601 in the first polarizing structure 6 may be 60 nm to 450 nm. For example, the phase difference of the first phase difference film layer 601 in the first polarizing structure 6 may be 68.75 nm, 137.5 nm, 206.25 nm or 412.5 nm. However, this embodiment is not limited thereto.

In an exemplary implementation mode, the second phase difference film layer 401 may be a quarter-wave plate. An included angle between the direction of the transmission axis of the second linear polarizing film layer 402 and a fast axis of the second phase difference film layer 401 in the second polarizing structure 4 may be 40 degrees to 50 degrees, or 130 to 140 degrees. For example, the included angle between the direction of the transmission axis of the second linear polarizing film layer 402 and the fast axis of the second phase difference film layer 401 may be 45 degrees or 135 degrees. In some embodiments, the second phase difference film layer may be a half-wave plate. However, this embodiment is not limited thereto. Herein, the fast axis refers to a light vector direction with fast propagation speed.

In an exemplary implementation mode, the first phase difference film layer 601 may be a quarter-wave plate. An included angle between the direction of the transmission axis of the first linear polarizing film layer 602 and a fast axis of the first phase difference film layer 601 in the first polarizing structure 6 may be 40 degrees to 50 degrees, or 130 to 140 degrees. For example, the included angle between the direction of the transmission axis of the first linear polarizing film layer 602 and the fast axis of the first phase difference film layer 601 may be 45 degrees or 135 degrees. In some embodiments, the first phase difference film layer may be a half-wave plate. However, this embodiment is not limited thereto.

Figure 6:
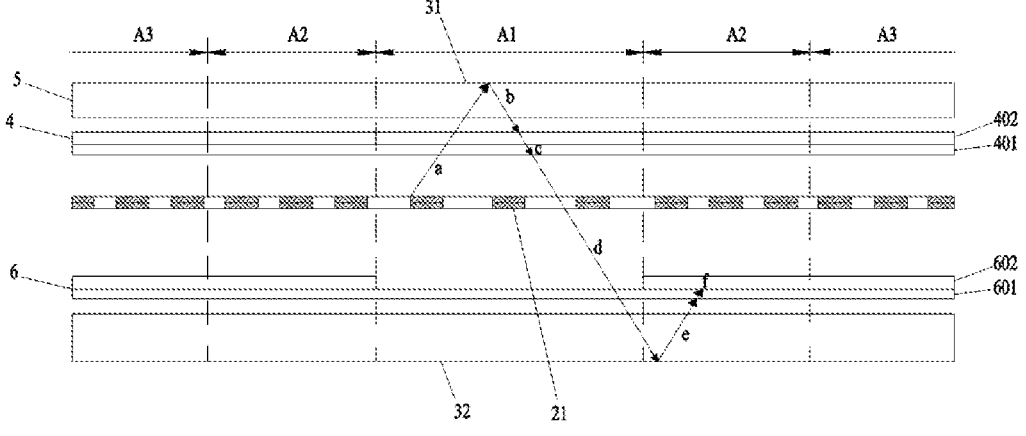
FIG. 6 is a schematic diagram of an optical path in a display substrate according to an embodiment of the present disclosure.

FIG. 6 is a schematic diagram of an optical path in a display substrate according to an embodiment of the present disclosure. In an exemplary implementation mode, an optical path of light in the display substrate according to the embodiment of the present disclosure is illustrated by taking an example in which the transmission axis of the second phase difference film layer 401 and the transmission axis of the first phase difference film layer 601 are both 0 degrees, the second phase difference film layer 401 has a phase difference of 137.5 nm, the included angle between the direction of the transmission axis of the second linear polarizing film layer 402 and the fast axis of the second phase difference film layer 401 is 45°, the phase difference of the first phase difference film layer 601 is 137.5 nm, and the included angle between the direction of the transmission axis of the first linear polarizing film layer 602 and the fast axis of the first phase difference film layer 601 is 45°. As shown in FIG. 6, when the first light emitting elements 21 in the first display area A1 emit light, a part of the light is emitted out of the display substrate for displaying an image, and a part of the light is totally reflected at the second reflective interface 31 formed at an interface between a side of the cover plate 5 away from the light emitting elements and an outer side of the display substrate, so as to form reflected light b emitted towards the second polarizing structure 4. The reflected light b, after passing through the second linear polarizing film layer 402, forms first linearly polarized light c with an included angle of 45° with respect to the fast axis of the second phase difference film layer 401. The first linearly polarized light c passes through the second phase difference film layer 401 to form left-handed first circularly polarized light d, and at least part of the first circularly polarized light d is emitted toward the first reflective interface 32. At least part of the first circularly polarized light d is emitted to the first reflective interface 32, is totally reflected at the first reflective interface 32, to form right-handed second circularly polarized light e. The second circularly polarized light e, after passing through the first phase difference film layer 601, forms second linearly polarized light f with an included angle of 135° with respect to the fast axis of the first phase difference film layer 601. A polarization direction of the second linearly polarized light f is perpendicular to the direction of the transmission axis of the first linearly polarizing film layer 602, so that the second linearly polarized light f cannot pass through the first linearly polarizing film layer 602, and further, the second circularly polarized light e is blocked at the first polarizing structure 6.

In an exemplary implementation mode, the optical path of the light in the display substrate according to the embodiment of the present disclosure is illustrated by taking an example in which the transmission axis of the second phase difference film layer 401 and the transmission axis of the first phase difference film layer 601 are both 0 degrees, the second phase difference film layer 401 has a phase difference of 137.5 nm, the included angle between the direction of the transmission axis of the second linear polarizing film layer 402 and the fast axis of the second phase difference film layer 401 is 45°, the phase difference of the first phase difference film layer 601 is 412.5 nm, and the included angle between the direction of the transmission axis of the first linear polarizing film layer 602 and the fast axis of the first phase difference film layer 601 is 135°. When the first light emitting elements 21 in the first display area A1 emit light, a part of the light is emitted out of the display substrate for displaying an image, and a part of the light is totally reflected at the second reflective interface 31 formed at the interface between a side of the cover plate 5 away from the light emitting elements and an outer side of the display substrate, so as to form reflected light emitted towards the second polarizing structure 4. The reflected light, after passing through the second linear polarizing film layer 402, forms first linearly polarized light with an included angle of 45° with respect to the fast axis of the second phase difference film layer 401. The first linearly polarized light passes through the second phase difference film layer 401 to form left-handed first circularly polarized light, and at least part of the first circularly polarized light is emitted toward the first reflective interface 32. At least part of the first circularly polarized light is emitted to the first reflective interface 32, and is totally reflected at the first reflective interface 32, to form right-handed second circularly polarized light. The second circularly polarized light, after passing through the first phase difference film layer 601, forms second linearly polarized light with an included angle of 45° with respect to the fast axis of the first phase difference film layer 601. A polarization direction of the second linearly polarized light is perpendicular to the direction of the transmission axis of the first linearly polarizing film layer 602, so that the second linearly polarized light cannot pass through the first linearly polarizing film layer 602, and further, the second circularly polarized light is blocked at the first polarizing structure 6.

In an exemplary implementation mode, the display substrate according to the embodiment of the present disclosure further includes a composite film 10 located in the second display area A2 and the third display area A3, that is, an orthographic projection of the composite film 10 on the base substrate 2 does not overlap with the first display area A1, but overlaps with the second display area A2 and the third display area A3. The composite film 10 is stacked on a side of the back plate 1 away from the base substrate 2. The orthographic projection of the composite film 10 on the base substrate 2 does not overlap with the first display area A1, which can prevent the composite film 10 from reducing the light transmittance of the first display area A1.

In an exemplary implementation mode, the composite film 10 may be made of a super clean foam (SCF) composite film. The composite film 10 generally includes an adhesive layer, a buffer layer, and a heat dissipation layer that are stacked sequentially in a direction away from the back plate 1. The composite film 10 can play a role of cushion for the stress acting on the display substrate, and can dissipate heat generated during operation of the display substrate to play a certain protection effect on the display substrate.

FIG. 2B is another cross-sectional view of a display substrate according to an embodiment of the present disclosure. In an exemplary implementation mode, as shown in FIG. 2B, in a plane perpendicular to the display substrate, the first display area A1 may include: a back plate 1, a first polarizing structure 6 provided on the back plate 1, a base substrate 2 provided on a side of the first polarizing structure 6 away from the back plate 1, multiple first light emitting elements 21 provided on a side of the base substrate 2 away from the back plate 1, an encapsulation layer 3 provided on a side of the first light emitting elements 21 away from the back plate 1, a second polarizing structure 4 provided on a side of the encapsulation layer 3 away from the back plate 1, and a cover plate 5 provided on a side of the second polarizing structure 4 away from the back plate 1. Herein, the first display area A1 is not provided with a pixel circuit layer, an orthographic projection of the first phase difference film layer 601 in the first polarizing structure 6 on the base substrate overlaps with the first display area A1, and an orthographic projection of the first linear polarizing film layer 602 in the first polarizing structure 6 on the base substrate does not overlap with the first display area A1, thereby preventing the first linear polarizing film layer 602 from reducing the light transmittance of the first display area A1.

As shown in FIG. 2B, in a plane perpendicular to the display substrate, the second display area A2 may include: the back plate 1, the first polarizing structure 6 provided on the back plate 1, the base substrate 2 provided on a side of the first polarizing structure 6 away from the back plate 1, a pixel circuit layer provided on a side of the base substrate 2 away from the back plate 1, multiple second light emitting elements 22 provided on a side of the pixel circuit layer away from the back plate 1, the encapsulation layer 3 provided on a side of the multiple second light emitting elements 22 away from the back plate 1, the second polarizing structure 4 provided on a side of the encapsulation layer 3 away from the back plate 1, and the cover plate 5 provided on a side of the second polarizing structure 4 away from the back plate 1. Herein, the pixel circuit layer includes multiple first pixel circuits and multiple second pixel circuits 11. The second display area A2 is provided with a pixel circuit layer and a first polarizing structure.

As shown in FIG. 2B, in a plane perpendicular to the display substrate, the third display area A3 may include: the back plate 1, the first polarizing structure 6 provided on the back plate 1, the base substrate 2 provided on a side of the first polarizing structure 6 away from the back plate 1, the pixel circuit layer provided on a side of the base substrate 2 away from the back plate 1, a trace layer provided on a side of the pixel circuit layer away from the back plate 1, multiple third light emitting elements 23 provided on a side of the trace layer away from the back plate 1, the encapsulation layer 3 provided on a side of the multiple third light emitting elements 23 away from the back plate 1, the second polarizing structure 4 provided on a side of the encapsulation layer 3 away from the back plate 1, and the cover plate 5 provided on a side of the second polarizing structure 4 away from the back plate 1. Herein, the pixel circuit layer includes multiple third pixel circuits 12. The trace layer includes multiple signal traces 7. The third display area A3 is provided with the pixel circuit layer, the trace layer and the first polarizing structure 6.

In an exemplary implementation mode, as shown in FIG. 2B, in a plane perpendicular to the display substrate, the first display area A1 is not provided with a pixel circuit layer and a trace layer, a first phase difference film layer 601 in the first polarizing structure 6 is located in the first display area A1, and a first linear polarizing film layer 602 in the first polarizing structure 6 is not located in the first display area A1. The second display area A2 is provided with the pixel circuit layer and the first polarizing structure, and is not provided with a trace layer. The third display area A3 is provided with the pixel circuit layer, the trace layer and the first polarizing structure.

In an exemplary implementation mode, an optical path of the light in the display substrate according to the embodiment of the present disclosure is illustrated by taking an example in which a transmission axis of a second phase difference film layer 401 and a transmission axis of the first phase difference film layer 601 are both 0 degrees, the second phase difference film layer 401 has a phase difference of 137.5 nm, an included angle between a direction of a transmission axis of the second linear polarizing film layer 402 and a fast axis of the second phase difference film layer 401 is 45°, a phase difference of the first phase difference film layer 601 is 68.75 nm, and an included angle between a direction of a transmission axis of the first linear polarizing film layer 602 and a fast axis of the first phase difference film layer 601 is 45°. When the first light emitting elements 21 in the first display area A1 emit light, a part of the light is emitted out of the display substrate for displaying an image, and a part of the light is totally reflected at the second reflective interface 31 formed at an interface between a side of the cover plate 5 away from the light emitting elements and an outer side of the display substrate, so as to form reflected light emitted towards the second polarizing structure 4. The reflected light, after passing through the second linear polarizing film layer 402, forms first linearly polarized light with an included angle of 45° with respect to the fast axis of the second phase difference film layer 401. The first linearly polarized light passes through the second phase difference film layer 401 to form left-handed first circularly polarized light, and at least part of the first circularly polarized light is emitted toward the first reflective interface 32. At least part of the first circularly polarized light is emitted to the first reflective interface 32, and is totally reflected at the first reflective interface 32, to form right-handed second circularly polarized light. The second circularly polarized light, after passing through the first phase difference film layer 601, forms second linearly polarized light with an included angle of 135° with respect to the fast axis of the first phase difference film layer 601. A polarization direction of the second linearly polarized light is perpendicular to the direction of the transmission axis of the first linearly polarizing film layer 602, so that the second linearly polarized light cannot pass through the first linearly polarizing film layer 602, and further, the second circularly polarized light is blocked at the first polarizing structure 6.

In an exemplary implementation mode, an optical path of light in the display substrate according to the embodiment of the present disclosure is illustrated by taking an example in which the transmission axis of the second phase difference film layer 401 and the transmission axis of the first phase difference film layer 601 are both 0 degrees, the second phase difference film layer 401 has a phase difference of 137.5 nm, the included angle between the direction of the transmission axis of the second linear polarizing film layer 402 and the fast axis of the second phase difference film layer 401 is 45°, the phase difference of the first phase difference film layer 601 is 206.25 nm, and the included angle between the direction of the transmission axis of the first linear polarizing film layer 602 and the fast axis of the first phase difference film layer 601 is 135°. When the first light emitting elements 21 in the first display area A1 emit light, a part of the light is emitted out of the display substrate for displaying an image, and a part of the light is totally reflected at the second reflective interface 31 formed at the interface between a side of the cover plate 5 away from the light emitting elements and an outer side of the display substrate, so as to form reflected light emitted towards the second polarizing structure 4. The reflected light, after passing through the second linear polarizing film layer 402, forms first linearly polarized light with an included angle of 45° with respect to the fast axis of the second phase difference film layer 401. The first linearly polarized light passes through the second phase difference film layer 401 to form left-handed first circularly polarized light, and at least part of the first circularly polarized light is emitted toward the first reflective interface 32. At least part of the first circularly polarized light is emitted to the first reflective interface 32, and is totally reflected at the first reflective interface 32, to form right-handed second circularly polarized light. The second circularly polarized light, after passing through the first phase difference film layer 601, forms second linearly polarized light with an included angle of 45° with respect to the fast axis of the first phase difference film layer 601. The polarization direction of the second linearly polarized light is perpendicular to the direction of the transmission axis of the first linearly polarizing film layer 602, so that the second linearly polarized light cannot pass through the first linearly polarizing film layer 602, and further, the second circularly polarized light is blocked at the first polarizing structure 6.

FIG. 3 is a schematic diagram of a display device according to an embodiment of the present disclosure. As shown in FIG. 3, a display device is provided in present disclosure, which includes a display substrate 100 and a photosensitive sensor 200 located on a light exit side away from the display substrate 100. There is an overlapping region between an orthographic projection of the photosensitive sensor 200 on the display substrate 100 and the first display area A1 in the display substrate.

In some examples, the display substrate 100 may be a flexible OLED display substrate, a QLED display substrate, a Micro-LED display substrate, or a Mini-LED display substrate. The display device may be any product or component with a display function such as an OLED display, a cell phone, a tablet, a television, a display, a laptop, a digital photo frame, a navigator, and so on, which is not limited in the embodiments of the present disclosure.

The present disclosure provides a method for manufacturing a display substrate, the display substrate may be any of the above-mentioned display substrates, the display substrate includes a first display area and a second display area, the second display area is located on at least one side of the first display area, and the first display area is an under-screen sensing region; the method for manufacturing the display substrate includes:

forming a base substrate in at least the first display area and the second display area;

forming a pixel circuit layer on at least the base substrate of the second display area;

forming a first reflective interface at least on a side of the base substrate away from the pixel circuit layer, wherein the first reflective interface is located at least in the first display area and the second display area; the first reflective interface reflects at least part of light toward the pixel circuit layer; and forming a first polarizing structure at least between the base substrate and the first reflective interface, wherein at least part of the first polarizing structure is located in the second display area, and the first polarizing structure is configured to block incidence of light reflected by the first reflective interface onto the pixel circuit layer.

Although the implementation modes disclosed in the present disclosure are described as above, the described contents are only implementation modes which are used for facilitating the understanding of the present disclosure, but are not intended to limit the present disclosure. Any skilled person in the art to which the present disclosure pertains may make any modification and variation in forms and details of implementation without departing from the spirit and scope of the present disclosure. However, the patent protection scope of the present disclosure should be subject to the scope defined by the appended claims.

The invention claimed is:

1. A display substrate comprising a first display area and a second display area, wherein the second display area is located on at least one side of the first display area, and the first display area is an under-screen sensing region; the display substrate at least comprises:

a base substrate at least located in the first display area and the second display area;

a pixel circuit layer, at least part of which is located in the second display area and on a side of the base substrate;

a first reflective interface located at least in the first display area and the second display area and located on a side of the base substrate away from the pixel circuit layer; the first reflective interface reflects at least part of light toward the pixel circuit layer; and a first polarizing structure, at least part of which is located in the second display area, and at least part of which is located between the base substrate and the first reflective interface, the first polarizing structure is configured to block incidence of light reflected by the first reflective interface onto the pixel circuit layer; and wherein the display substrate further comprises:

a plurality of first light emitting elements located in the first display area and on a side of the base substrate away from the first reflective interface;

a second reflective interface located at least in the first display area and the second display area and at least on a side of the plurality of first light emitting elements away from the base substrate, and the second reflective interface forms light emitted by at least one first light emitting element into reflected light; and a second polarizing structure, located at least in the first display area and the second display area and at least between the plurality of first light emitting elements and the second reflective interface, the second polarizing structure is configured to transmit the reflected light, so that the transmitted reflected light forms first circularly polarized light and the first circularly polarized light is emitted toward the first reflecting interface; and wherein the first reflective interface is configured to form the incident first circularly polarized light into second circularly polarized light and to reflect at least a part of the second circularly polarized light to the first polarizing structure; the first polarizing structure is configured to block incidence of the second circularly polarized light onto the pixel circuit layer.

2. The display substrate according to claim 1, further comprising a third display area located on at least one side of the first display area and the second display area, at least part of the pixel circuit layer is located in the third display area, and at least part of the first polarizing structure is located in the third display area.

3. The display substrate according to claim 1, wherein the second polarizing structure comprises a second linear polarizing film layer and a second phase difference film layer which are stacked, the second phase difference film layer is located on a side of the second linear polarizing film layer close to the base substrate, the second linearly polarizing film layer is configured to transmit the reflected light and form the transmitted reflected light into first linearly polarized light, and the second phase difference film layer is configured to transmit the first linearly polarized light and form the transmitted first linearly polarized light into the first circularly polarized light.

4. The display substrate according to claim 1, wherein the first polarizing structure comprises a first linear polarizing film layer and a first phase difference film layer which are stacked, the first phase difference film layer is located on a side of the first linear polarizing film layer close to the base substrate, the first phase difference film layer is configured to transmit the second circularly polarized light and form the transmitted second circularly polarized light into second linearly polarized light, and the first linearly polarizing film layer is configured to block transmission of the incident second linearly polarized light.

5. The display substrate according to claim 4, wherein a polarization direction of the second linearly polarized light is perpendicular to a polarization direction of the first linearly polarizing film layer.

6. The display substrate according to claim 4, wherein an orthographic projection of the first linear polarizing film layer on the base substrate does not overlap with the first display area, and at least a part of an orthographic projection of the first phase difference film layer on the base substrate overlaps with the first display area.

7. The display substrate according to claim 1, wherein an orthographic projection of the first polarizing structure on the base substrate does not overlap with the first display area.

8. The display substrate according to claim 1, further comprising a back plate at least located in the first display area and the second display area, and at least located on a side of the first polarizing structure away from the base substrate, and the first reflective interface is formed at an interface between a surface of the back plate away from the base substrate and an outer side of the display substrate.

9. The display substrate according to claim 8, further comprising a composite film located at least in the second display area, the composite film is located at least on a side of the back plate away from the base substrate, and an orthographic projection of the composite film on the base substrate does not overlap with the first display area.

10. The display substrate according to claim 1, further comprising a cover plate located at least in the first display area and the second display area; the cover plate is located on a side of the second polarizing structure away from the base substrate; the second reflective interface is formed at an interface between a surface of the cover plate away from the base substrate and an outer side of the display substrate.

11. The display substrate according to claim 1, further comprising: an encapsulation layer located at least in the first display area and the second display area, the encapsulation layer is located on a side of the pixel circuit layer away from the base substrate.

12. The display substrate according to claim 1, further comprising a plurality of second light emitting elements, the pixel circuit layer comprises a plurality of first pixel circuits and a plurality of second pixel circuits, the plurality of second light emitting elements, the plurality of first pixel circuits and the plurality of second pixel circuits are all located in the second display area, the plurality of second light emitting elements are located on a side of the pixel circuit layer away from the base substrate, the first pixel circuits are electrically connected with the first light emitting elements, and the second pixel circuits are electrically connected with the second light emitting elements.

13. The display substrate according to claim 12, wherein spacing between the first light emitting elements is greater than spacing between the second light emitting elements; and/or, an area of the first light emitting elements is less than an area of the second light emitting elements.

14. The display substrate according to claim 12, wherein the second display area has 3 or 4 second light emitting elements arranged in a direction away from the first display area.

15. The display substrate according to claim 14, wherein an orthographic projection of the first polarizing structure on the base substrate overlaps with an orthographic projection of the 3 or 4 second light emitting elements on the base substrate.

16. The display substrate according to claim 1, further comprising a light absorption layer located at least in the first display area and the second display area, and the light absorption layer is stacked between the first polarizing structure and the first reflective interface.

17. The display substrate according to claim 1, further comprising a light shielding layer located in the second display area, an orthographic projection of the light shielding layer on the base substrate does not overlap with the first display area, and the light shielding layer is stacked on a side of the pixel circuit layer close to the base substrate.

18. A display device, comprising the display substrate according to claim 1, and a photosensitive sensor located on a side away from a light exit side of the display substrate, and an orthographic projection of the photosensitive sensor on the display substrate overlaps with the first display area in the display substrate.

19. A method for manufacturing a display substrate, the display substrate comprises a first display area and a second display area, the second display area is located on at least one side of the first display area, and the first display area is an under-screen sensing region; the method for manufacturing the display substrate comprises:

forming a base substrate in at least the first display area and the second display area;

forming a pixel circuit layer on at least the base substrate of the second display area;

forming a first reflective interface at least on a side of the base substrate away from the pixel circuit layer, wherein the first reflective interface is located at least in the first display area and the second display area; the first reflective interface reflects at least part of light toward the pixel circuit layer; and forming a first polarizing structure at least between the base substrate and the first reflective interface, wherein at least part of the first polarizing structure is located in the second display area, and the first polarizing structure is configured to block incidence of light reflected by the first reflective interface on the pixel circuit layer; and wherein the method for manufacturing the display substrate further comprises:

forming a plurality of first light emitting elements on a side of the base substrate away from the first reflective interface, wherein the plurality of first light emitting elements are located in the first display area;

forming a second reflective interface at least on a side of the plurality of first light emitting elements away from the base substrate, wherein the second reflective interface is located at least in the first display area and the second display area, and the second reflective interface forms light emitted by at least one first light emitting element into reflected light; and forming a second polarizing structure at least between the plurality of first light emitting elements and the second reflecting interface, wherein the second polarizing structure is located at least in the first display area and the second display area, and the second polarizing structure is configured to transmit the reflected light, so that the transmitted reflected light forms first circularly polarized light and the first circularly polarized light is emitted toward the first reflecting interface; and wherein the first reflective interface is configured to form the incident first circularly polarized light into second circularly polarized light and to reflect at least a part of the second circularly polarized light to the first polarizing structure; the first polarizing structure is configured to block incidence of the second circularly polarized light onto the pixel circuit layer.

* * * * *